United States Patent
Kraemer et al.

(10) Patent No.: US 11,469,770 B2
(45) Date of Patent: Oct. 11, 2022

(54) ARCHITECTURE FOR MULTIPLIER ACCUMULATOR USING UNIT ELEMENTS FOR MULTIPLICATION, BIAS, ACCUMULATION, AND ANALOG TO DIGITAL CONVERSION OVER A SHARED CHARGE TRANSFER BUS

(71) Applicant: Redpine Signals, Inc., San Jose, CA (US)

(72) Inventors: Martin Kraemer, Mountain View, CA (US); Ryan Boesch, Louisville, CO (US); Wei Xiong, Mountain View, CA (US)

(73) Assignee: Ceremorphic, Inc., San Jose, CA (US)

( * ) Notice: Subject to any disclaimer, the term of this patent is extended or adjusted under 35 U.S.C. 154(b) by 0 days.

(21) Appl. No.: 17/163,493

(22) Filed: Jan. 31, 2021

(65) Prior Publication Data
US 2022/0247425 A1 Aug. 4, 2022

(51) Int. Cl.
H03M 1/12 (2006.01)
H03M 3/04 (2006.01)
G06F 7/544 (2006.01)
H03M 1/38 (2006.01)

(52) U.S. Cl.
CPC ............ *H03M 3/04* (2013.01); *G06F 7/5443* (2013.01); *H03M 1/38* (2013.01)

(58) Field of Classification Search
CPC .................................. H03M 3/04; H03M 1/38
USPC .................................................. 341/155, 143
See application file for complete search history.

(56) References Cited

U.S. PATENT DOCUMENTS

| | | | |
|---|---|---|---|
| 9,281,834 B1 | 3/2016 | Waltari | |
| 10,417,460 B1 | 9/2019 | Youssefi | |
| 11,055,062 B1* | 7/2021 | Youssefi | G06F 7/4983 |
| 2012/0309290 A1* | 12/2012 | Simmons | H04B 1/40 455/73 |
| 2019/0042199 A1 | 2/2019 | Sumbul et al. | |
| 2020/0192971 A1 | 6/2020 | Lue et al. | |
| 2020/0401206 A1 | 12/2020 | Kallam et al. | |

OTHER PUBLICATIONS

Search report dated Jul. 7, 2022 from USPTO on related PCT case PCT/US22/14586.

* cited by examiner

*Primary Examiner* — Peguy Jean Pierre
(74) *Attorney, Agent, or Firm* — File-EE-Patents.com; Jay A. Chesavage

(57) ABSTRACT

An architecture for a multiplier-accumulator (MAC) uses a common Unit Element (UE) for each aspects of operation, the MAC formed as a plurality of MAC UEs, a plurality of Bias UEs, and a plurality of Analog to Digital Conversion (ADC) UEs which collectively perform a scalable MAC operation and generate a binary result. Each MAC UE, BIAS UE and ADC UE comprises groups of NAND gates with complementary outputs arranged in AND-groups, each AND gate coupled to a charge transfer bus through a charge transfer capacitor Cu to form an analog multiplication product. Each UE transfers differential charge to the charge transfer bus. The analog charge transfer bus is coupled to groups of ADC UEs with an ADC controller which enables and disables the ADC UEs using successive approximation to determine the accumulated multiplication result.

21 Claims, 14 Drawing Sheets

Multiplication of two three bit binary numbers

R=A*B=[a2 a1 a0] * [b2 b1 b0]:

a0 * [0  0  b2 b1 b0]
a1 * [0  b2 b1 b0]
a2 * [b2 b1 b0]

$$R = [\underbrace{0}_{p5} \quad \underbrace{a2b2}_{p4} \quad \underbrace{a1b2+a2b1}_{p3} \quad \underbrace{a0b2+a1b1+a2b0}_{p2} \quad \underbrace{a0b1+a1b0}_{p1} \quad \underbrace{a0b0}_{p0}]$$

$$R = 2^5 * p5 + 2^4 * p4 + 2^3 * p3 + 2^2 * p2 + 2^1 * p1 + 2^0 * p0$$

Scaleable Unit Element-based MAC, Bias, ADC

Unit Element—Negative

Unit Element-Positive

Charge Transfer Capacitor Layout

BIAS UE-Negative

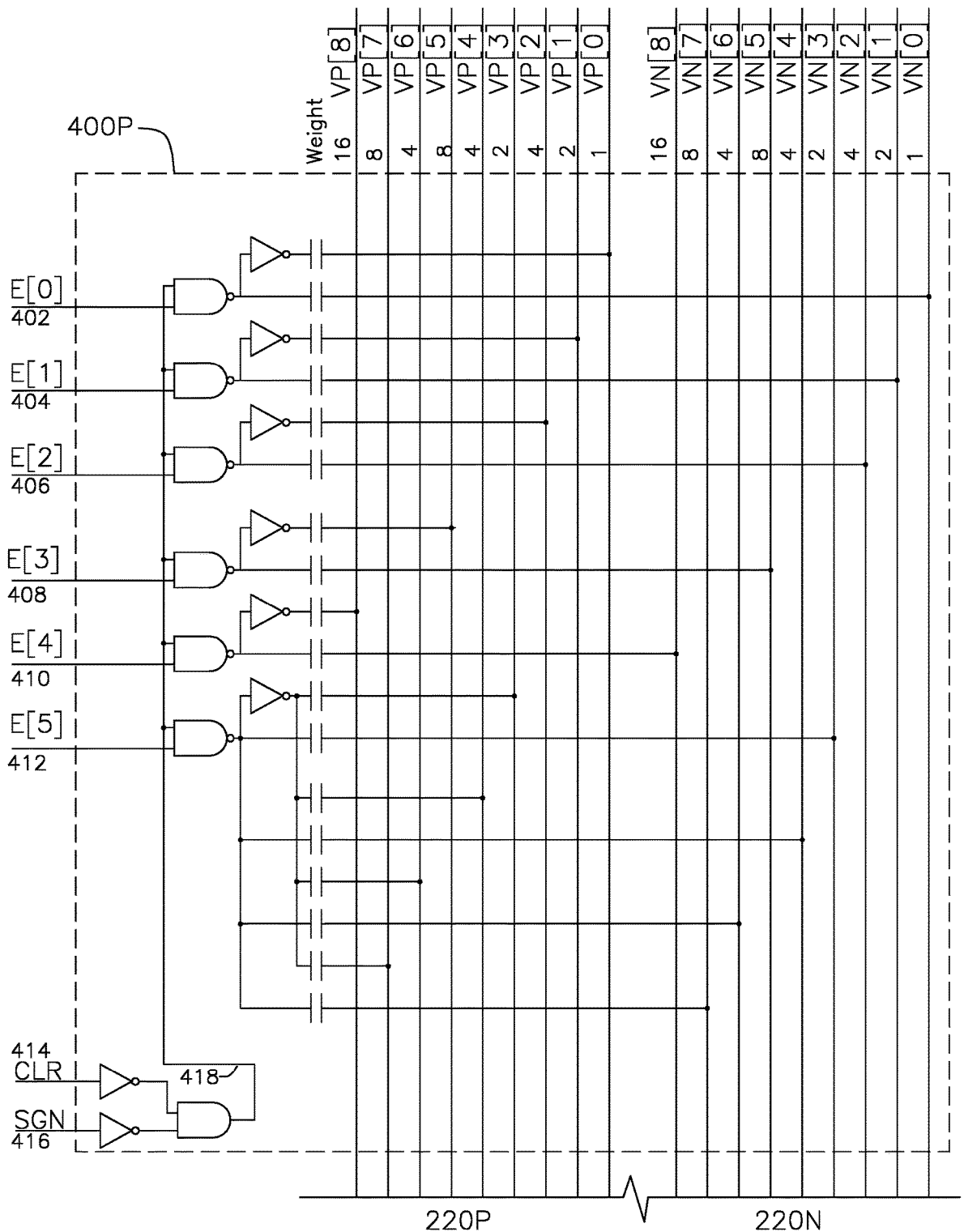

SAR ADC Block Diagram using Bias UE

Analog Charge Bus Combiner

SAR Logic and Control

SAR Logic and Control with Relu

SAR Controller Waveforms

Scaleable Unit Element-based MAC, Bias, ADC

ARCHITECTURE FOR MULTIPLIER ACCUMULATOR USING UNIT ELEMENTS FOR MULTIPLICATION, BIAS, ACCUMULATION, AND ANALOG TO DIGITAL CONVERSION OVER A SHARED CHARGE TRANSFER BUS

FIELD OF THE INVENTION

The present invention relates to a multiplier-accumulator (MAC). In particular, the invention relates to an architecture for a scaleable asynchronous multiplier-accumulator with unit element (UE) stages that can be cascaded and configured to operate as MAC-UEs, Bias UEs, and analog to digital converter (ADC) UEs. The MAC accepts digital activation X inputs and kernel W inputs and generates an accumulated dot product output as a digital value representing a sum of multiplication products.

BACKGROUND OF THE INVENTION

The expanded use of Artificial Intelligence (AI) software applications has created a need for scalable hardware multiplier-accumulators for acceleration of software algorithms used in machine learning (ML). An n×n multiplier increases in gate complexity as $n^2$, and large numbers of adders are further needed for multiply-accumulate operations. Additionally, prior art multipliers relied on synchronous, clocked stages to operate, and the clocked operation results in increased power dissipation.

For example, in machine learning applications, it is often desired to form dot products in the form of multiply-accumulate operations between a 1×n input row vector X (referred to as an activation input) and a n×m W weighting coefficient matrix also referred to as a kernel to generate a n×1 column matrix result R, such as:

$$[X_1 \ X_2 \ \ldots \ X_n] \cdot \begin{bmatrix} W_{11} & \ldots & W_{1m} \\ \vdots & \ddots & \vdots \\ W_{n1} & \ldots & W_{nm} \end{bmatrix} =$$

$$\begin{bmatrix} R_1 \\ \vdots \\ R_n \end{bmatrix}^T = \begin{bmatrix} X_1 W_{11} + X_2 W_{21} + \ldots + X_n W_{n1} \\ X_1 W_{12} + X_2 W_{22} + \ldots + X_n W_{n2} \\ \vdots \\ X_1 W_{1m} + X_2 W_{2m} + \ldots + X_n W_{nm} \end{bmatrix}^T$$

It is desired to provide an architecture for a multiplier and multiplier-accumulator which operates asynchronously and minimizes power consumption from displacement currents in the multiplier accumulator internal circuitry. This power savings can be realized by an architecture which minimizes displacement currents when the kernel (coefficient matrix W) is static as is commonly the case in ML applications. It is further desired to provide a common unit element structure for the various MAC processing steps, including a bias input and Analog to Digital Converter. It is further desired to provide an architecture for a MAC, Bias and ADC using a common unit element structure coupled to a charge transfer bus.

OBJECTS OF THE INVENTION

A first object of the invention is an architecture for a multiply-accumulate (MAC) having a first plurality of MAC unit elements (MAC UEs) performing multiply-accumulate operations on X and W digital inputs, each MAC UE providing a result as a charge transferred to a differential charge transfer bus, a second plurality of Bias unit elements (Bias UEs) performing a bias operation and placing a bias value as a charge onto the differential charge transfer bus, and a third plurality of ADC unit elements (ADC UEs) operative to convert a charge present on the differential charge transfer bus into a digital output value.

A second object of the invention is a MAC unit element (MAC UE) operative to transfer charge values from multiplication results of a digital X input with a digital W input and transferring the multiplication result as a charge representing each multiplication result onto a charge transfer bus comprising binary weighted positive charge transfer lines and binary weighted negative charge transfer lines, the MAC UE comprising a plurality of NAND-groups, each NAND group comprising a plurality of NAND gates, each NAND gate of each NAND-group receiving one of the W input bits and each of the X input bits, each NAND gate having a positive output coupled through a binary weighted positive charge transfer capacitor to a unique positive charge transfer line and a binary weighted negative output coupled through a negative charge transfer capacitor to a unique negative charge transfer line.

A third object of the invention is a MAC unit element (MAC UE) accepting an X digital input and a W digital input accompanied by a Sign bit input, the MAC UE comprising a positive unit element and a negative unit element, the MAC unit element operative to transfer a charge corresponding to a multiplication result of the digital X input with the digital W input and sign bit, the charge being transferred as a differential charge onto a differential charge transfer bus comprising positive charge transfer lines and negative charge transfer lines, each charge transfer line having an associated binary weight according to X and W bits being multiplied;

the positive unit element enabled when the sign bit is positive, the positive unit element comprising a plurality of NAND-groups, each NAND group comprising a plurality of NAND gates, each NAND gate of a NAND-group receiving one of the W input bits and each of the X input bits, each NAND gate having a positive output coupled through a positive charge transfer capacitor to a unique positive charge transfer line and a negative output coupled through a negative charge transfer capacitor to a unique negative charge transfer line;

the negative unit element enabled when the sign bit is negative, the negative unit element comprising a plurality of NAND-groups, each NAND group comprising a plurality of NAND gates, each NAND gate receiving one of the W input bits and each of the X input bits, each NAND gate having a positive output coupled through a positive charge transfer capacitor to a unique negative charge transfer line and a negative output coupled through a negative charge transfer capacitor to a unique positive charge transfer line.

A fourth object of the invention is a planar fabrication charge transfer capacitor for coupling charge from a Unit Element (UE) generating a positive charge first output V_PP and a positive charge second output V_NP, the first output coupled to a positive charge line comprising a continuous first planar conductor, a continuous second planar conductor parallel to the first planar conductor, and a continuous third planar conductor parallel to the first planar conductor and second planar conductor, the charge transfer capacitor comprising, in sequence: a first co-planar conductor segment, the first planar conductor, a second co-planar conductor segment, the second planar conductor, a third co-planar conductor segment, the third planar conductor, and a fourth coplanar conductor segment, the first and third coplanar conductor segments coupled to the UE first output V_PP, the second and fourth coplanar conductor segments coupled to the UE second output V_NP.

A fifth object of the invention is a charge transfer capacitor for a unit element generating positive outputs V_PP and V_NP, and negative outputs V_PN and V_NN, where V_PN is the complement of V_PP, and V_NP is the complement of V_NN, the charge transfer capacitor having a positive charge transfer line and a negative charge transfer line, the charge transfer capacitor comprising:

a plurality of parallel continuous positive conductors and a plurality of parallel continuous negative conductors;

a first V_PP conductor segment coupled to one edge of a first positive charge conductor, the opposite edge of the first positive charge conductor coupled to an edge of a first V_NP conductor segment, the opposite edge of the first V_NP conductor segment coupled to a second positive charge conductor, the opposite edge of the second positive charge conductor coupled to an edge of a first V_PP conductor segment, the opposite edge of the first V_PP conductor segment coupled to an edge of a third positive charge conductor, the opposite edge of the third positive charge conductor coupled to an edge of a second V_NP conductor segment;

a first V_PN conductor segment coupled to one edge of a first negative charge conductor, the opposite edge of the first negative charge conductor coupled to an edge of a first V_NN conductor segment, the opposite edge of the first V_NN conductor segment coupled to a second negative charge conductor, the opposite edge of the second negative charge conductor coupled to an edge of a second V_PN conductor segment, the opposite edge of the second V_PN conductor segment coupled to an edge of a third negative charge conductor, the opposite edge of the third negative charge conductor coupled to an edge of a second V_NN conductor segment;

the first positive charge conductor, second positive charge conductor, and third positive charge conductor coupled to the positive charge transfer line;

the first negative charge conductor, second negative charge conductor, and third negative charge conductor coupled to the negative charge transfer line;

the unit element output V_PP coupled to the first and second V_PP conductor segments, unit element output V_NP coupled to the first and second V_NP conductor segments, the unit element output V_PN coupled to the first and second V_PN conductor segments, and unit element output V_NN coupled to the first and second V_NN conductor segments.

A sixth object of the invention is a bias unit element receiving a sign bit and a digital E input, the bias unit element comprising a positive UE enabled when the sign bit is positive (logic 0) and a negative UE enabled when the sign bit is negative (logic 1), the positive UE and negative UE coupled to a plurality of positive charge transfer lines and negative charge transfer lines;

each bit of the positive UE transferring a positive charge to a respective positive charge transfer line and transferring a negative charge to a respective negative charge transfer line when a false to true transition occurs, and transferring a positive charge to a respective negative charge transfer line and transferring a negative charge to a respective positive charge transfer line when a true to false transition occurs;

each bit of the negative UE transferring a charge to a respective negative charge transfer line when a false to true transition occurs or to a respective positive charge transfer line when true to false transition occurs.

A seventh object of the invention is an analog to digital converter (ADC) for a positive charge bus and a negative charge bus, the ADC comprising:

a differential charge transfer bus, the differential charge transfer bus having a positive charge transfer bus and a negative charge transfer bus, each positive charge transfer bus and negative charge transfer bus comprising a plurality of binary weighted charge transfer lines;

a plurality of groups of ADC unit elements (UE) coupled to the differential charge transfer bus, each group of ADC unit elements comprising a plurality of ADC unit elements, the number of ADC unit elements in each group being a factor of two greater than a number of unit elements in a previous ADC unit element group, each ADC UE having an E input determining an amount of charge to be transferred when an ADC UE is enabled;

the differential charge transfer bus coupled to a charge combiner providing a positive charge output and a negative charge output;

a controller coupled to the positive charge output and the negative charge output, the ADC controller comprising:

a comparator coupled to the positive charge output and negative charge output, the comparator configured to assert an output when a positive charge output voltage exceeds a negative charge output voltage;

the controller enabling and disabling groups of ADC unit elements in a successive approximation sequence according to the comparator output value, with each successive decision to enable a successive group of ADC unit elements determined by the comparator output, the sequence of comparator output values being components of a digital value corresponding to a charge being converted to a binary output value.

SUMMARY OF THE INVENTION

A unified architecture for a multiplier accumulator has a charge transfer bus which is common to a plurality of multiplier-accumulator unit elements (MAC UE), a plurality of Bias Unit Elements (Bias UE), and a plurality of Analog to Digital Converter Unit Elements (ADC_UE), the ADC_UEs coupled to a successive approximation register (SAR) controller. The MAC UEs, Bias UEs, and ADC UEs interconnected with the common charge transfer bus sharing positive charge transfer lines and negative charge transfer lines of the charge transfer bus. The MAC UEs and Bias UEs each generate offsetting complementary charges to the respective positive and negative charge transfer lines, such that when a charge is added to or subtracted from a positive charge transfer line, an equal charge is respectively subtracted or added to a corresponding negative charge transfer line. This balance in charge displacement eliminates common mode imbalances when later converting the charges on the bus into a voltage.

The positive charge transfer line and negative charge transfer line are organized according to a bit weight of an X input comprising bits [x2,x1,x0] multiplied by a kernel W comprising bits [w2,w1,w0] and applying a sign bit. The positive and negative charge transfer lines are configured such that bit 0 of the X input (x0) multiplied by bits 0, 1, and 2 of a W input transfers charges to respective binary weighted charge transfer lines with respective binary weights 1, 2, and 4. Bit 1 of the X input (x1) multiplied by bits 0, 1, and 2 of the W input transfers charge to respective charge transfer lines with respective binary weights 2, 4, and 8. Bit 2 of the X input (x2) multiplied by bits 0, 1, and 2 of the W input transfer charges to respective charge transfer lines with respective binary weights 4, 8, and 16. In this manner, the multiplication of a three bit X value with a three bit W value transfers charge to binary weight charge transfer lines with ascending charge transfer line weights 1, 2, 4, 2, 4, 8, 4, 8, 16.

The plurality of MAC UEs each accept a unique X activation input and (typically) a shared W kernel input which updates for each new column multiply-accumulate, each MAC UE generating differential charge displacements onto the shared charge transfer bus according to a positive to negative transition or a negative to positive transition applied to a charge transfer capacitor coupled to a charge transfer line. Each MAC UE has a positive UE part and a negative UE part, the positive UE part is enabled when the sign is positive and the negative UE part is enabled when the sign is negative.

The Bias UEs have a very similar UE architecture as the MAC UE, and add a bias charge from an E[5:0] input to the accumulated result as may be required for activation. The Bias UE adds a differential charge to the charge transfer bus according to the input value presented to the Bias UEs.

The ADC coupled to the charge transfer bus comprises a binary weighted sequence of groups of ADC UEs which controlled as binary weighted groups of ADC UEs by an ADC controller to transfer charge in and out of the shared charge transfer bus to successively estimate the charge value stored in the MAC UEs and Bias UEs according to the binary weight of each charge transfer line. The successive approximation approach also provides for a programmable accuracy, since the digitized output is a bit sequence which starts with the most significant bit, and the programmable accuracy may provide additional reduction in power consumption by stopping the conversion early when needed. The ADC optionally accepts a Rectified Linear Unit (ReLU) input, which may be used to perform a ReLU activation function by terminating the ADC conversion and outputting 0 for negative results that are detected early in conversion, thereby additionally reducing power consumption by early termination of the ADC conversion process upon detection of a net negative charge value on the charge transfer bus.

BRIEF DESCRIPTION OF THE DRAWINGS

FIGS. 4A and 4B show a schematic diagram of a negative Bias Unit Element and positive Bias Unit Element, respectively.

DETAILED DESCRIPTION OF THE INVENTION

Figures 1A, 1B, 1C:
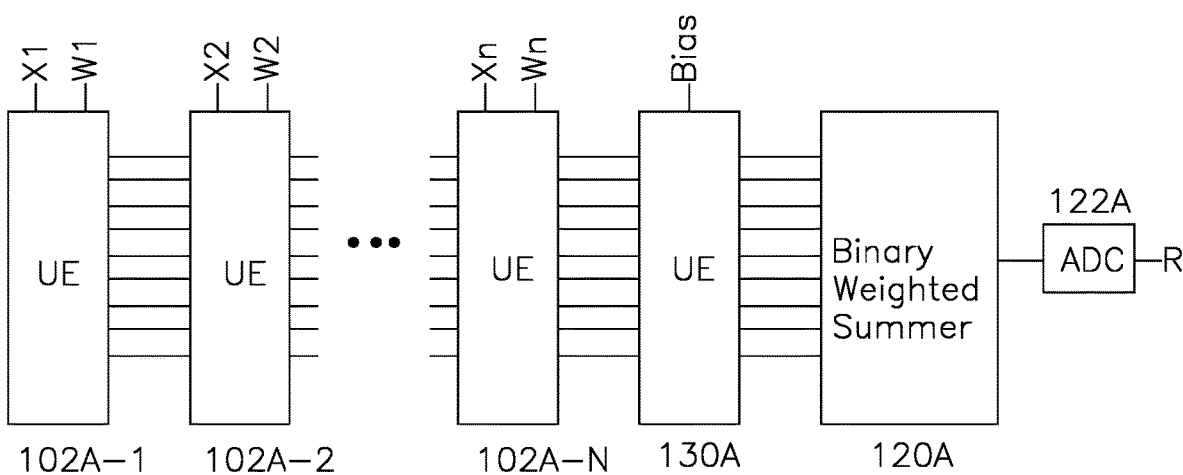
FIG. 1A shows an example multiplication of two 3 bit multiplicands.
FIG. 1B shows an expansion of the multiplication of FIG. 1A identifying individual terms.
FIG. 1C shows a block diagram for an accumulating multiplier performing dot product operations.

By way of convention, in the present application, similar reference numbers on different figures indicate the same element or function. Where a function is performed by individual elements, the suffixes a, b, c, A, B, C, 1, 2, 3, etc., may be appended as appears in the drawings, whereas the elements taken as a whole are understood to be without suffix, so for example unit element 102 is understood to refer to any such structure when a suffix a, b, c, A, B, C, or −1, −2, −3, etc. is not present.

FIGS. 1A and 1B show an example expansion for multiplication of two 3 bit binary numbers. This may also be described as the partial product expansion:

p0[2:0]={a[0]&b[2], a[0]&b[1], a[0]&b[0]}
p1[2:0]={a[1]&b[2], a[1]&b[1], a[1]&b[0]}
p2[2:0]={a[2]&b[2], a[2]&b[1], a[2]&b[0]} which can be rearranged as a weighted charge transfer bus where W=x indicates the weight of the charge transfer line:

R[W=1]=1*p0[0]
R[W=2]=2*p0[1]
R[W=4]=4*p0[2]
R[W=2]=2*p1[0])
R[W=4]=4*p1[1]
R[W=8]=8*p1[2]
R[W=4]=4*p2[0]
R[W=8]=8*p2[1]
R[W=16]=16*p2[2]

In one example embodiment, the binary charge summing may be performed by selection of relative capacitor values in the charge summing unit to provide the indicated weights during summing.

Figure 1D:
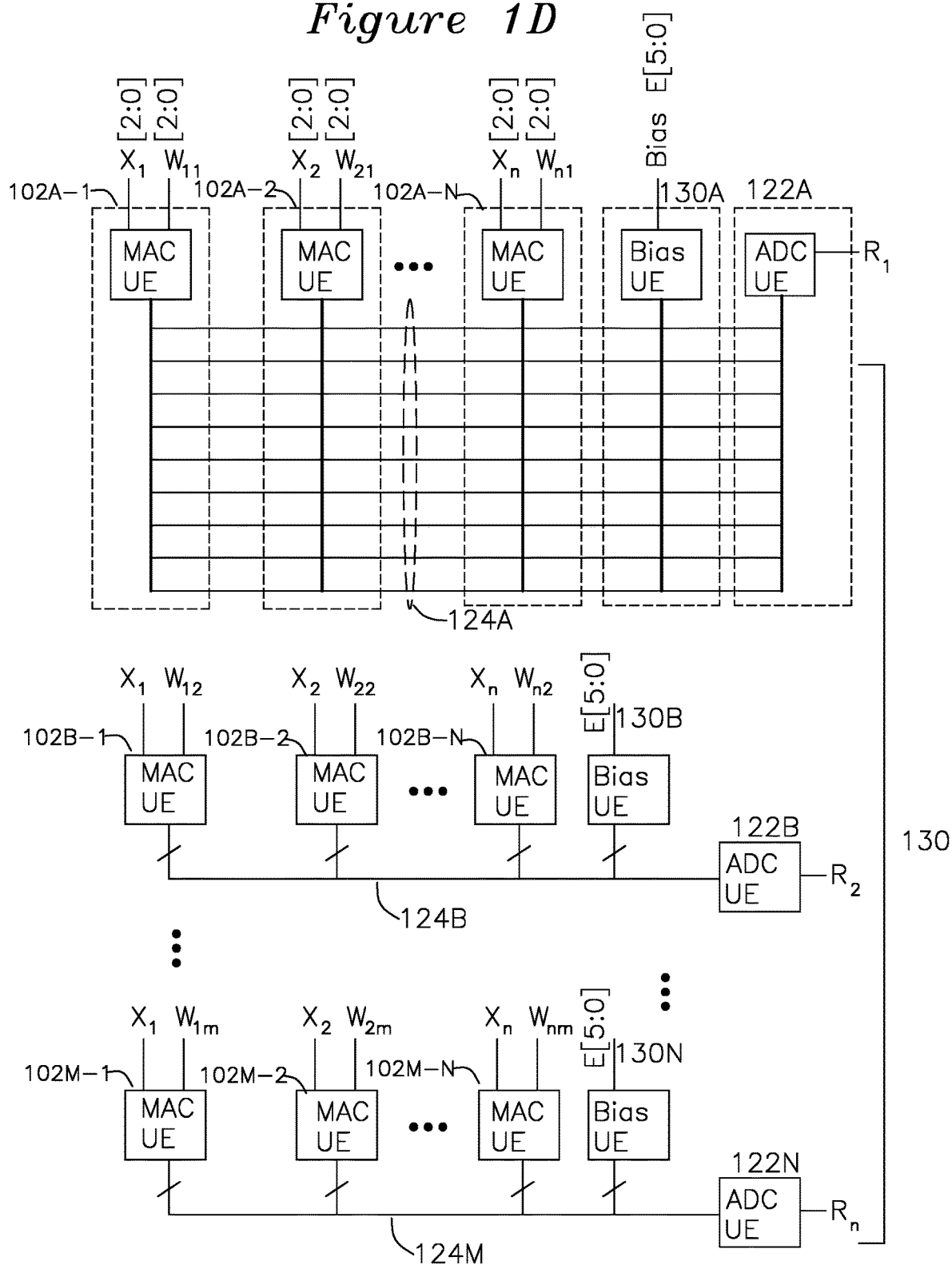
FIG. 1D shows a block diagram of 2D MAC operation including charge summing and ADC.

FIG. 1C shows a single row computation and FIG. 1D shows a block diagram example for a complete dot product for implementing the dot product:

$$[X_1 \ X_2 \ \ldots \ X_n] \cdot \begin{bmatrix} W_{11} & \ldots & W_{1m} \\ \vdots & \ddots & \vdots \\ W_{n1} & \ldots & W_{nm} \end{bmatrix} =$$

$$\begin{bmatrix} R_1 \\ \vdots \\ R_n \end{bmatrix}^T = \begin{bmatrix} X_1 W_{11} + X_2 W_{21} + \ldots + X_n W_{n1} \\ X_1 W_{12} + X_2 W_{22} + \ldots + X_n W_{n2} \\ \vdots \\ X_1 W_{1m} + X_2 W_{2m} + \ldots + X_n W_{nm} \end{bmatrix}^T$$

MAC Unit Elements (UE) 102A-1 through 102A-N perform the MAC computation for element R1 of the dot product, MAC UE 102B-1 through 1-2B-N perform the computation for element R2 of the dot product, and MAC UE 102M-1 through 102M-N perform the MAC computation for element Rn. Accordingly, the architecture of the present invention provides for any number of UEs to be arranged in rows and columns as shown to provide an expandable dot matrix computation for an arbitrary size of the X activation matrix and W kernel matrix. Additionally, the architecture provides flexibility in being reconfigured for a larger or smaller number of X and W matrices.

Figure 2:
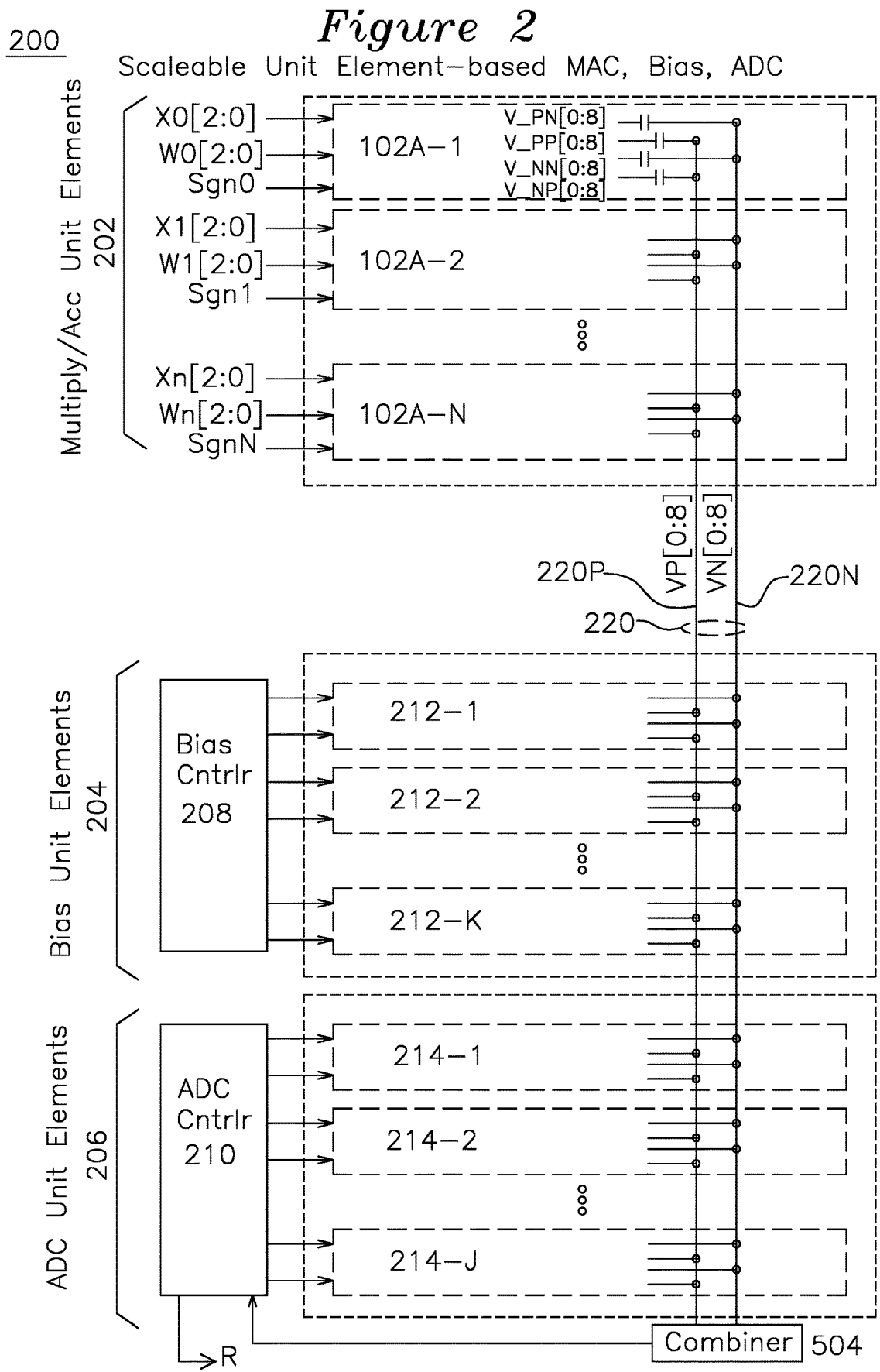
FIG. 2 shows a block diagram of a MAC architecture with a plurality of MAC UEs, a plurality of Bias UEs, and a plurality of ADC UEs sharing a common charge transfer bus.

FIG. 2 shows a block diagram of an overall architecture for the multiplier-accumulator with example MAC UEs 202 comprising 102A-1 to 102A-n of FIGS. 1C and 1D, BIAS UEs 204 comprising 212-1 to 212-k, and ADC UEs 206 comprising ADC UE groups 214-1 through 214-J. A shared charge transfer bus 220 includes a plurality of positive charge transfer lines Vp 220P and a plurality of negative charge transfer lines Vn 220N which are common to the MAC UEs 202, Bias UEs 204, and ADC UEs 206. Each MAC UE in the present example receives a three bit X input [x2, x1, x0] and a three bit W input [w2, w1, w0] accompanied by a sign bit Sgn. The W input and X inputs are integers of range 0-7 and the sign bit is a binary value indicating a positive or negative value which may be associated with the W input. Each MAC unit element has an AND or NAND gate operating in a unique combination of digital X input and digital W input, each AND or NAND gate generating complementary charge transfer outputs, one of which is coupled through a positive charge transfer capacitor to a respective positive charge transfer line and the other through a negative charge transfer capacitor to a respective negative charge transfer line. The charge transfer capacitors of each MAC are of equal capacitance value Cu.

Bias UE 204 comprises a plurality K of Bias UEs 212-1 to 212-K which receive a bias input that may be used to provide a signed offset charge value to the charge transfer bus. The bias UE has a similar differential charge transfer bus architecture as the MAC UE 202, where each bias input provides complementary charges to the positive and negative charge transfer busses 220P and 220N, respectively.

ADC UE 206 comprises a plurality of UE groups 214-1 through 214-J for conversion of the charges transferred to the positive and negative charge transfer busses 220P to 220N into a digital output value which represents an associated MAC output R value for the overall MAC and Bias operations of each MAC UE and Bias UE of 202 and 204, respectively.

Figure 3A:
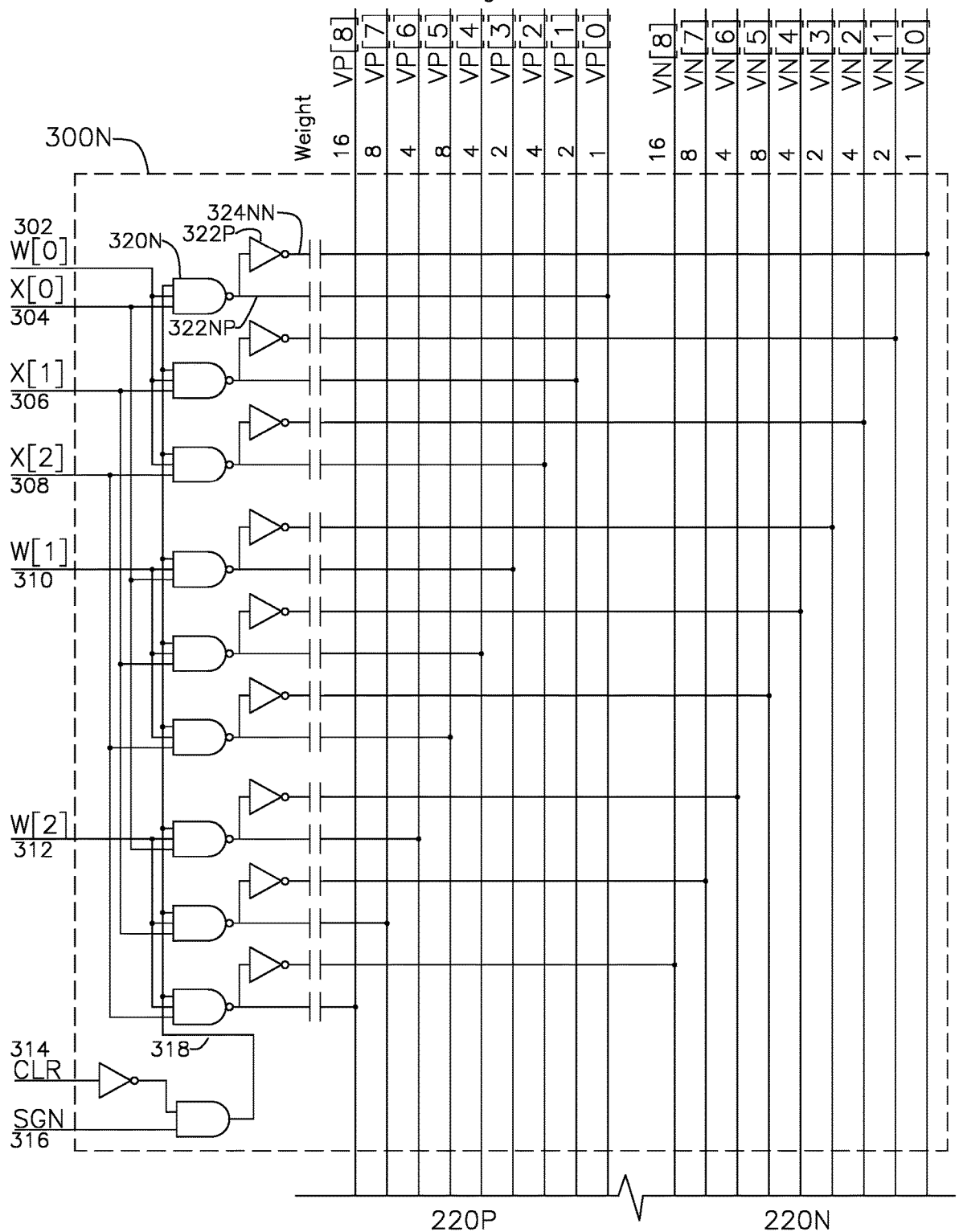
FIGS. 3A and 3B show a schematic diagram of a negative MAC Unit Element and positive MAC Unit Element, respectively.
Figure 3B:
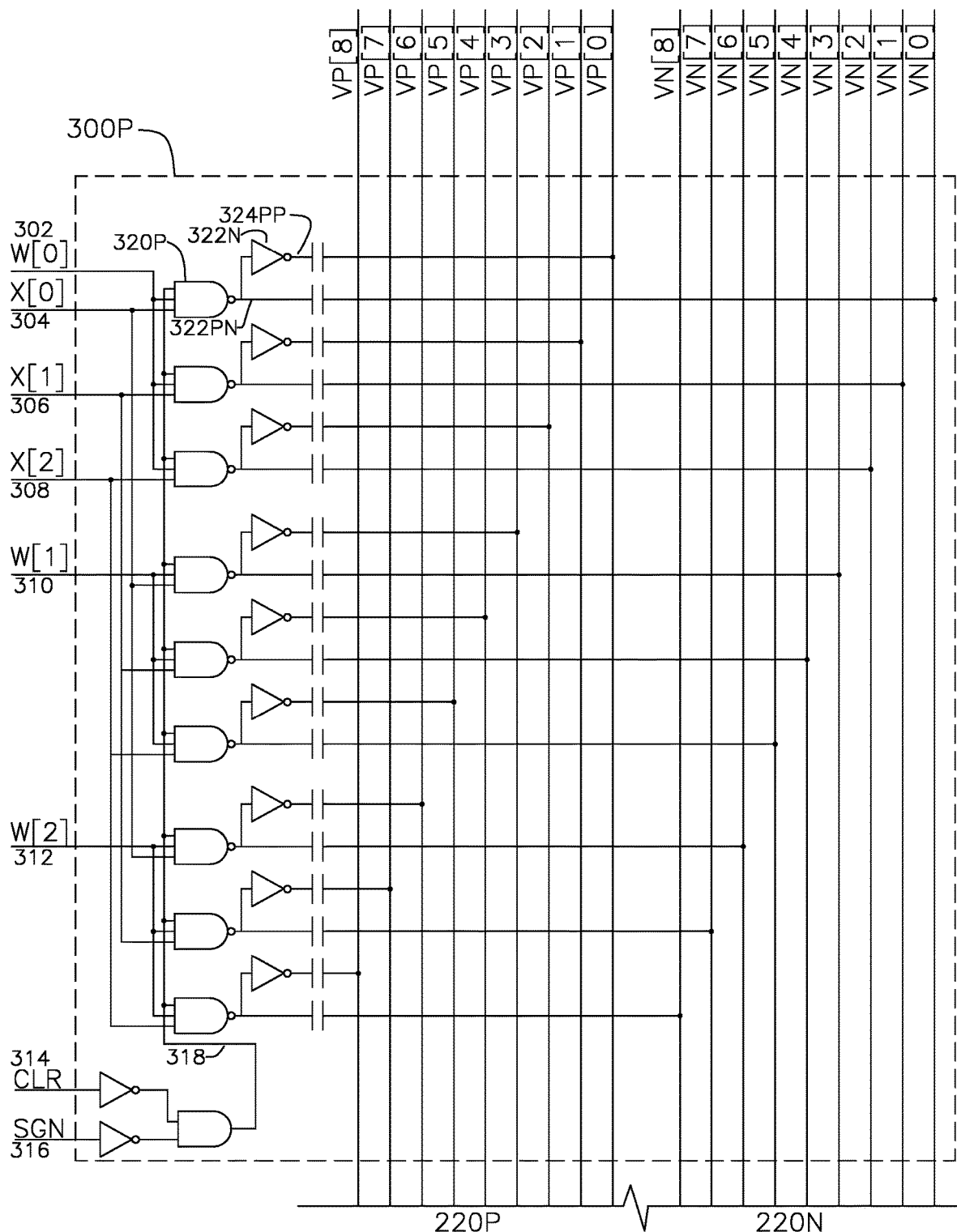

FIGS. 3A and 3B show a schematic diagram for the unit elements 300P and 300N, corresponding to any of the 102 prefix UEs of FIG. 1C, 1D, or 2. Shared positive charge transfer bus 220P and shared negative charge transfer bus 220N are connected to the charge transfer lines common to each MAC UE such as 102 or 300P and 300N according to the weight of each charge transfer line. The MAC UE 300P and 300N receives the X input X[0], X[1], and X[2] along with W inputs W[0], W[1], and W[2], which are distributed to NAND gates having a complementary output such as 320P with output 320PP and complementary output 324PN. Each NAND gate generates a product output and product complementary output and has an associated bit weight as was described in FIG. 1B, where W[0] multiplied by X[0], X[1], X[2] generates the charge transfer line weights 1, 2, 4 corresponding to VP[0], VP[1], and VP[2], respectively and complementary VN[0], VN[1], and VN[2], respectively. A set of NAND or AND gates which generate a particular W bit weight are referred to as a NAND-group, the number of NAND-groups equal to the number of W bits and the number of NAND gates in a NAND-group equal to the number of X bits. The NAND-group architecture has the advantage of minimizing the number of gate which have outputs changing state and transferring charge for static W values. The NAND-group which multiplies W[1] with by X[0], X[1], X[2] generates complementary outputs with respective charge transfer line weights 2, 4, and 8, and the NAND-group which multiplies W[2] by X[0], X[1], X[2] generates complementary outputs with respective charge transfer line weights 4, 8, and 16. Accordingly, for a MAC UE multiplying three bits of X with three bits of W, 9 charge transfer lines may be used, each charge line having a positive and negative component and coupled to the complementary outputs of a corresponding NAND gate. Other configurations are possible, for example, the charge transfer lines of weight 2 may be combined, as can the charge transfer lines of weight 4, as can the charge transfer lines of weight 8, thereby reducing the number of charge lines on each positive and negative charge transfer bus to five lines each, however it is believed that the symmetry and layout of an associated integrated circuit performing the MAC and Bias functions is greatly simplified by the present design shown in FIGS. 3A and 3B. The MAC UE 300P of FIG. 3B is enabled when SGN 316 is positive (input=0) and MAC UE 300N of FIG. 3A is enabled when SGN 316 is negative (input=1), and whichever UE is enabled, the multiplication result is transferred as complementary positive and negative charges to respective positive and negative charge transfer lines according to weight. Charge is added to a respective charge transfer line through a respective charge transfer capacitor coupled to the output of a NAND gate or inverter when a gate transitions from low to high, and charge is removed from a respective charge transfer line when the gate transitions from high to low. The differential nature of the offsetting transitions of FIGS. 3A and 3B provide reduced susceptibility to common mode offset errors which would occur for single ended charge transfers for a UE with only a positive charge transfer bus.

Figure 3C:
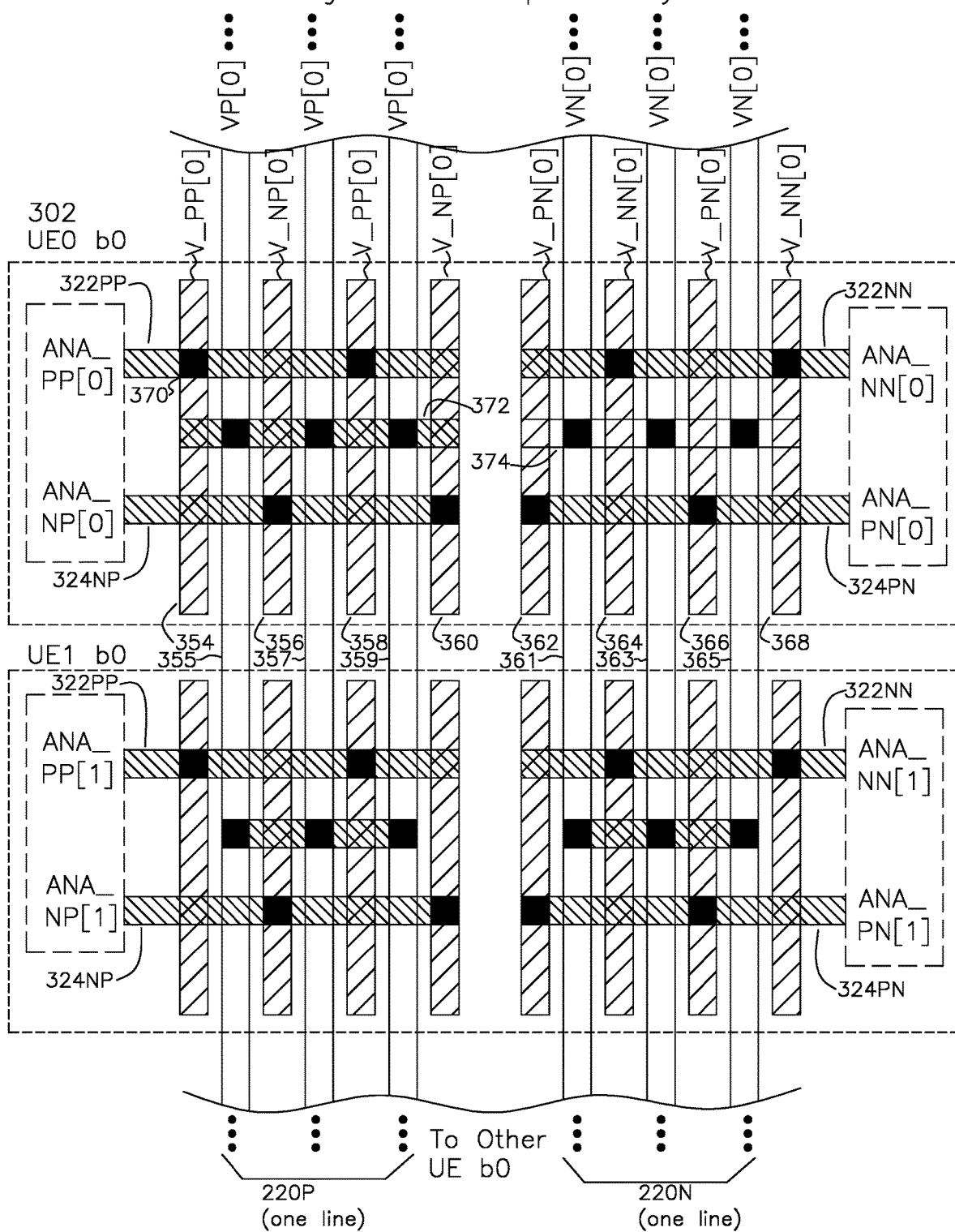
FIG. 3C shows a layout configuration for charge transfer capacitors which may be used with the MAC UEs, Bias UEs, or ADC UEs.

One difficulty of the architecture of FIGS. 3A and 3B is that a very large number of UEs are required, and the positive and negative charge transfer lines are shared across all UEs. Accordingly, it is desired to provide a uniform layout for use with an integrated circuit layout. FIG. 3C shows an example embodiment showing a single charge transfer capacitor layout, where each unit element 302 generates complementary outputs 322PP and 324PN and also complementary outputs 322NN and 324NP corresponding to the reference numbers of the outputs of FIGS. 3A and 3B, respectively. These outputs are arranged topologically in an example IC layout so that the UE positive outputs 322PP and 324NP couple charge into respective first positive charge conductor 355, second positive charge conductor 357, and third positive charge conductor 359, while the UE negative outputs 322NN and 324PN couple charge into first negative charge conductor 361, second negative charge conductor 363, and third negative charge conductor 365. V_PP first and second conductive segments 354 and 358 are connected to the MAC UE output 322PP and edge couple charge into first and second positive charge conductors 355 and 357, and V_NP conductive first and second segments 356 and 360 are connected to MAC UE output 324NP and edge couple charge into second and third positive charge conductors 357 and 359.

V_NN conductive first and second segments 364 and 368 are connected to the MAC UE output 322NN and edge couple charge into first and second negative charge conductors 361 and 363, and V_PN conductive first and second segments 362 and 366 are connected to MAC UE output 324PN and edge couple charge into second and third negative charge conductors 363 and 365. Other MAC UE outputs are similarly bussed together for each associated positive and negative charge line. The outputs 322PP, 324NP, 322NN, and 324PN may be connected to respective segments with horizontal conductive traces on a lower layer which are connected to associated conductive segments 354 and 358; 356 and 360; 364 and 368; 362 and 366, respectively by interlayer connections such as 372 and 374. In this manner, each of the charge transfer capacitors coupling charge from complementary outputs may be performed for each AND or NAND gate of each charge transfer line of each MAC UE, bias UE, or ADC UE.

Figure 4A:
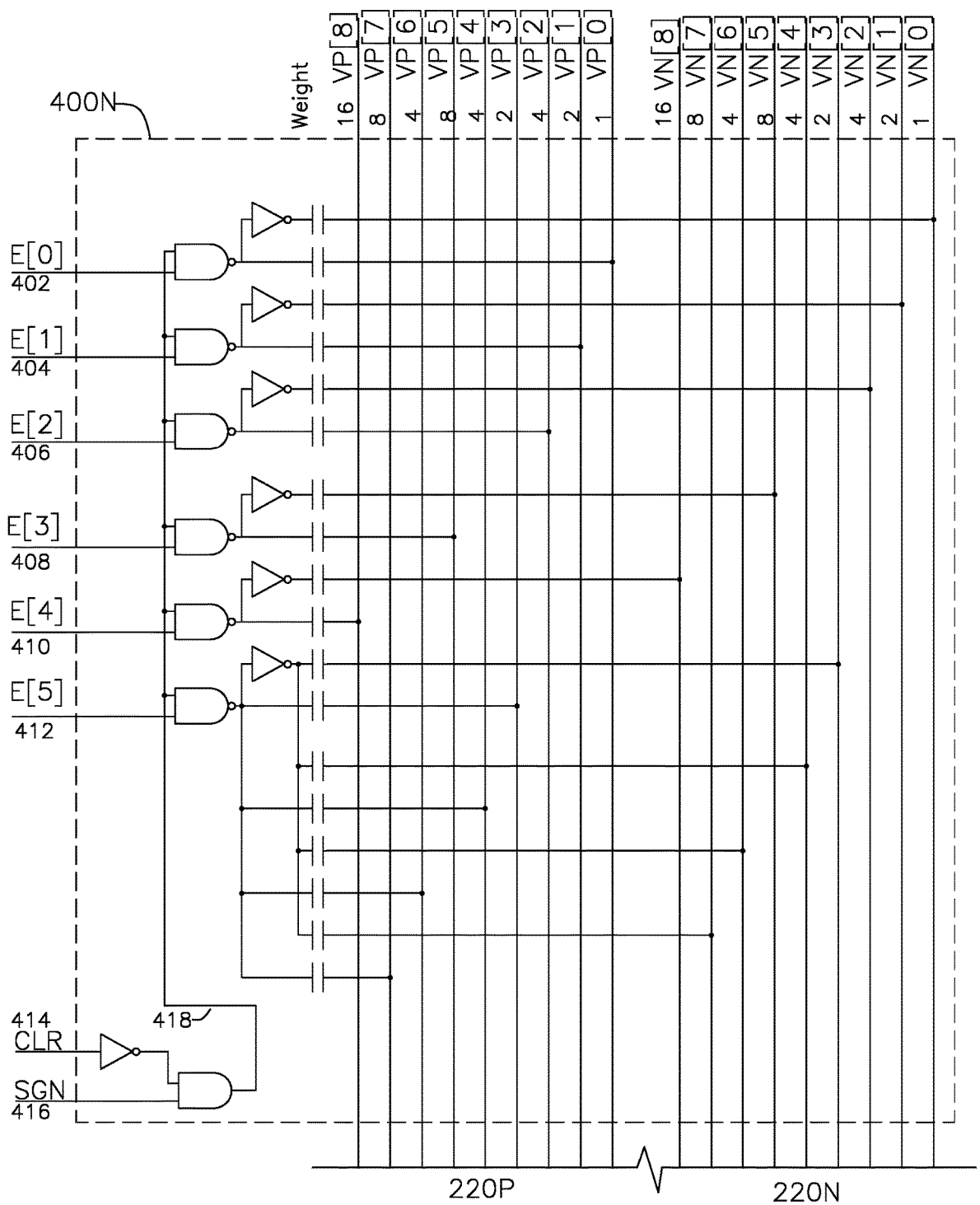

FIGS. 4A and 4B show an example Bias UE in one example of the invention, comprising a positive bias UE part 400P of FIG. 4A and negative bias UE part 400N shown in FIG. 4B. Each bias UE part is operative to provide a complementary bias to a particular binary weighted charge transfer line, as can be seen from the weight labels for charge transfer lines VP[8:0] and VN[8:0]. Accordingly, E[0] transfers complementary positive and negative charges to VP[0] and VN[0] having a charge transfer line binary weight 1, E[1] transfers complementary positive and negative charges to VP[1] and VN[1] having charge transfer line binary weight 2, E[2] transfers complementary positive and negative charges to VP[2] and VN[2] having charge transfer line binary weight 4, E[3] transfers complementary positive and negative charges to VP[5] and VN[5] having charge transfer line binary weight 8, E[4] transfers complementary positive and negative charges to VP[8] and VN[8] having charge transfer line binary weight 16. There is not a charge transfer line with a weight of 32, but for additional bias, E[5] transfers complementary positive and negative charges to VP[3,4,6,7] together, as well as VN[3, 4, 6, 7] having individual binary weights of 2, 4, 4, and 8, respectively, summing to a combined bias weight of 18. As with the MAC UE, the positive Bias UE part 400P is enabled when the SGN bit 416 is positive and the negative Bias UE part 400N is enabled when the SGN bit 416 is negative, and the charge is transferred as a complementary charge to the positive and negative charge transfer lines to reduce common mode errors at the ADC.

Figure 5A:
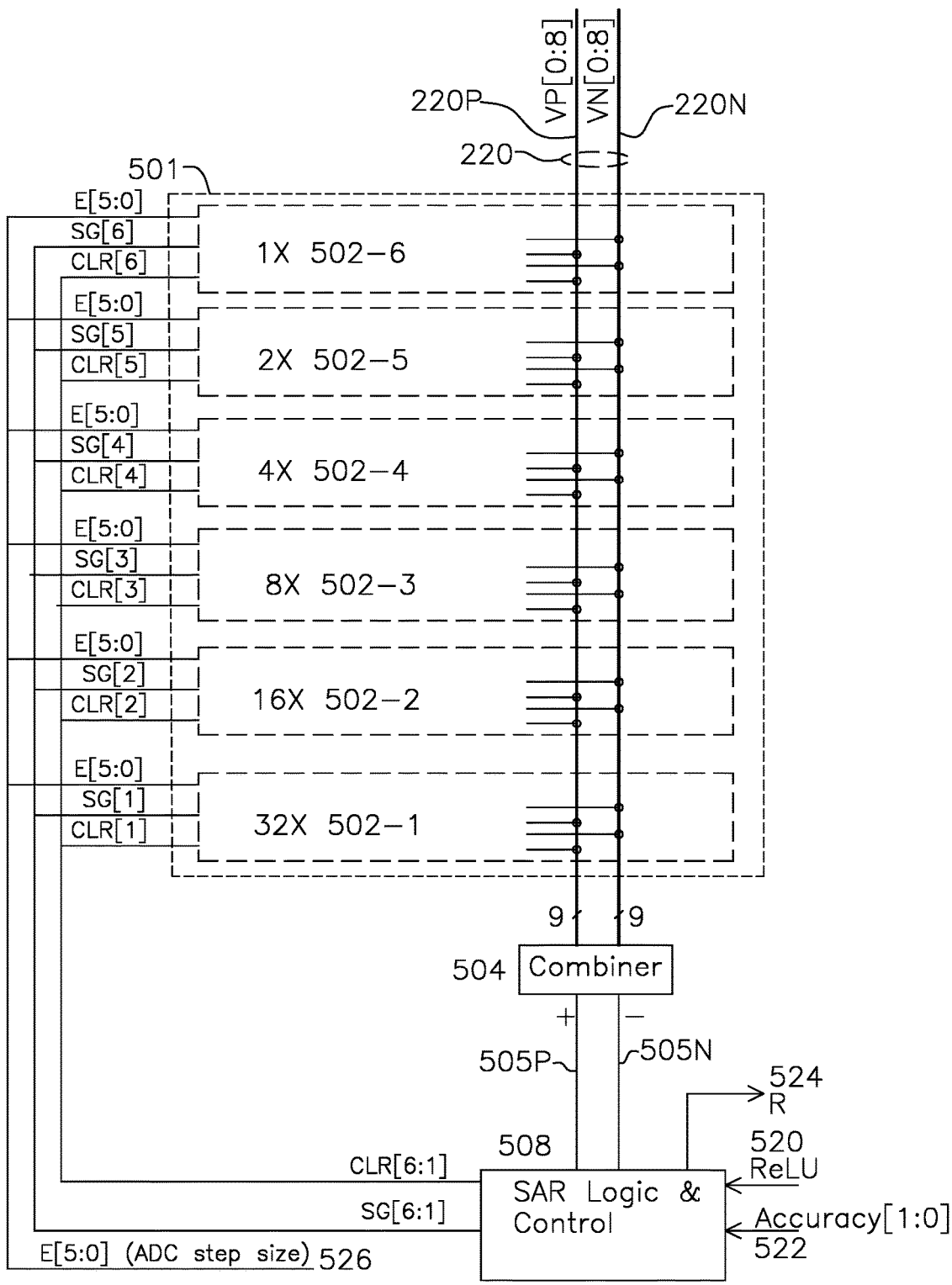
FIG. 5A shows a block diagram of a Successive Approximation ADC controller with a plurality of ADC UEs.

FIG. 5A shows an ADC 501 coupled to charge transfer bus 220, and which converts the charge transferred to the positive and negative busses to a digital output R 524. The ADC comprises a binary sequence of SAR UEs 501. The SAR-UE groups 502-1 though 502-6 are a binary sequence of a single ADC UE 502-6, two ADC UEs 502-5, four ADC UEs 502-4, eight ADC UEs 502-3, sixteen ADC UEs 502-2, and thirty two ADC UEs 502-1 for an example 6 bit ADC converter. The ADC UEs collectively act on input E[5:0] which sets the ADC step size as an independent input which is typically fixed for a particular configuration of ADC UEs. Each ADC UE is connected to a respective SIGN bit SG [6:1] and a respective Clear bit CLR[6:1] which are ADC UE inputs generated by SAR controller 508. The combined SAR UE charge transfer bus 220 comprising positive charge transfer bus 220P and negative charge transfer bus 220N is connected to charge combiner 504 which performs a binary weighted charge summing which provides a positive output 505P and negative output 505N to SAR controller 508, which also receives input ReLU 520 indicating that a conversion should output a fixed value such as 0 if the input value presented is negative, and optional accuracy input 522 for shortening the number of conversion cycles for additional power savings.

Figure 5B:
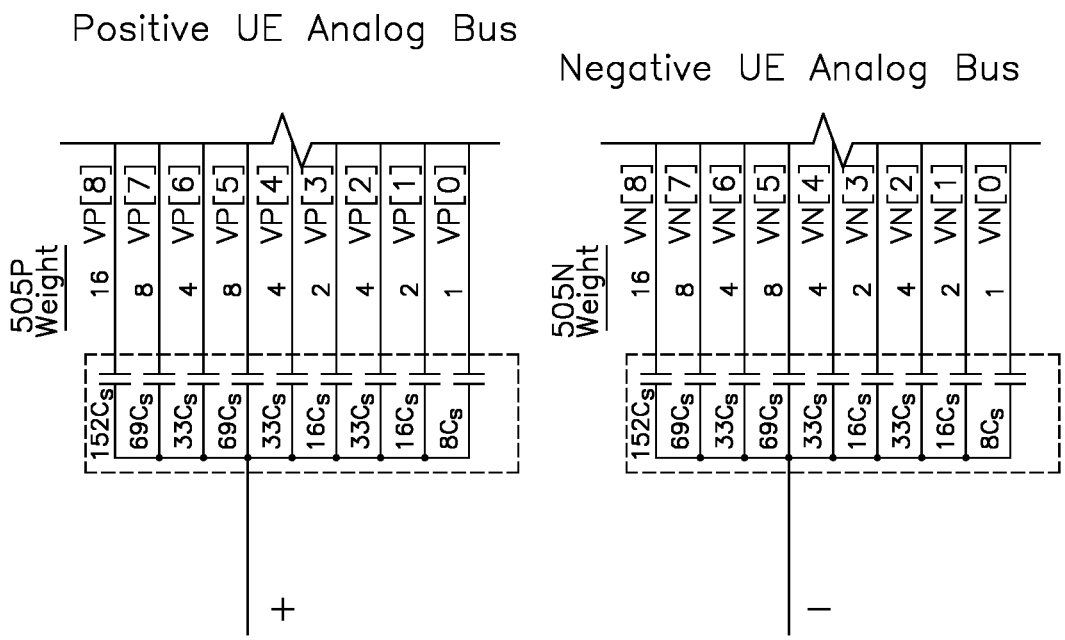
FIG. 5B shows an example charge combiner for FIG. 5A.

FIG. 5B shows the charge transfer bus combiner 504 for use with FIG. 5A (and also shown in FIG. 2). The binary weighted charge transfer lines are coupled to respective summing capacitors which provide binary weights such as 1, 2, 4, 2, 4, 8, 4, 8, 16 as shown in FIG. 5B for the analog charges coupled to them by ADC UE charge transfer capacitors of FIGS. 3A and 3B. The summing capacitor values for each charge control line are selected to provide the binary weighting according to the number of charge transfer capacitors loading respective analog charge transfer lines from the MAC UEs 102, Bias UEs 212, and ADC UEs 214. The capacitor value for each summing capacitor can be determined from the formula:

$$C[1] = \frac{Ccombiner[1]}{C_u} \text{ and } C[k] = \frac{N*2^{k-1}C[1]}{N-(2^{k-1}-1)C[1]}$$

where:

Cu is the value of each charge transfer capacitor from a NAND or inverter gate output to a charge transfer line of each MAC UE, which is the same as the charge transfer capacitor value in each Bias UE and each ADC UE;

C[1] is the value of the charge summing capacitor of coupled to charge transfer line with weight 1 (shown as 8 Cs in FIG. 5B);

C[k] is the value of each higher order charge summing capacitor.

k corresponds to the weight value of the summing capacitor associated with each charge transfer line 908a, with k having the weight value shown for each respective charge transfer line The values shown in FIG. 5B correspond to N=766 (total number of UE coupled to the charge transfer bus for an example configuration.

Figure 5C:
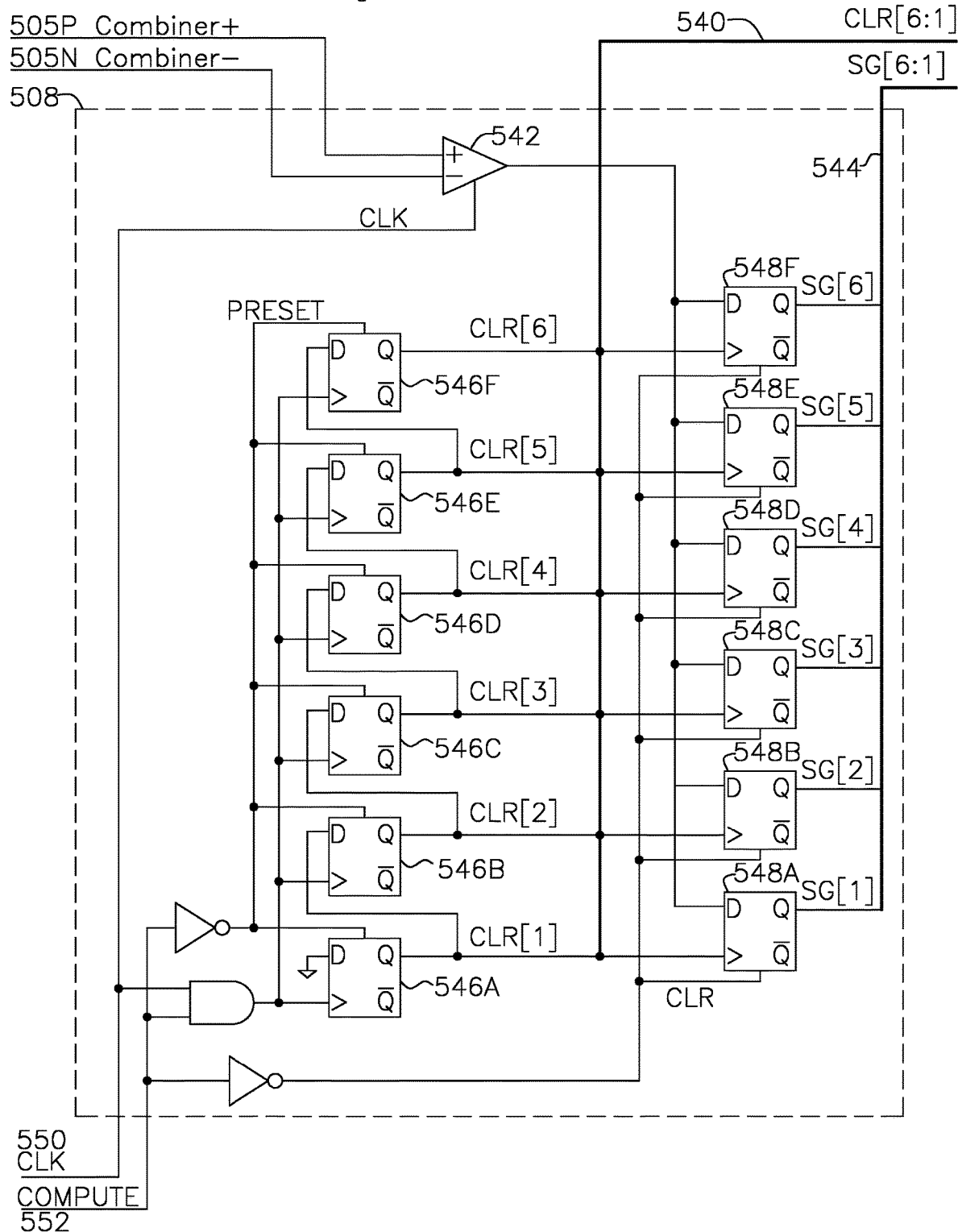
FIG. 5C shows a successive approximation logic and control module for FIG. 5A.

FIG. 5C shows an example Successive Approximation Register (SAR) logic and control module 508 of FIG. 5A. Positive and negative charge combiner outputs 505P and 505N, respectively, from FIG. 5A are input to SAR logic and control module 508 and applied to comparator 542. When not asserted, COMPUTE input 552 presets the DFF 546A through 546F, which asserts CLR[1] through CLR[6] delivered to the Bias UEs of FIGS. 4A and 4B, with input E[5:0] being a fixed value which establishes the successive approximation step size, which scales the displaced charge onto the charge transfer bus 220 with the binary weighted number of Bias UEs 502-6 through 502-1 being switched according to the respective SG and CLR inputs generated by SAR logic 508. When COMPUTE is asserted, the CLK 550 input is distributed to CLR DFF 546A through 546F, which operates to maintain each UE in a clear state until enabled by a sign bit (SGn) for each corresponding UE. The previous comparator result is presented to all DFF 548A through 548F, however only associated DFF with a low to high transition on a corresponding DFF 546A through 546F generating a clock signal input to DFF 548A to 548C generate an output transition from low to high. Each subsequent clock cycle performs a successive approximation operation, switching the sign input of a subsequent number of UEs from 502-1 to 502-6, each subsequent UE-ADC group which is half the previous number of UEs which were switched.

Figure 5D:
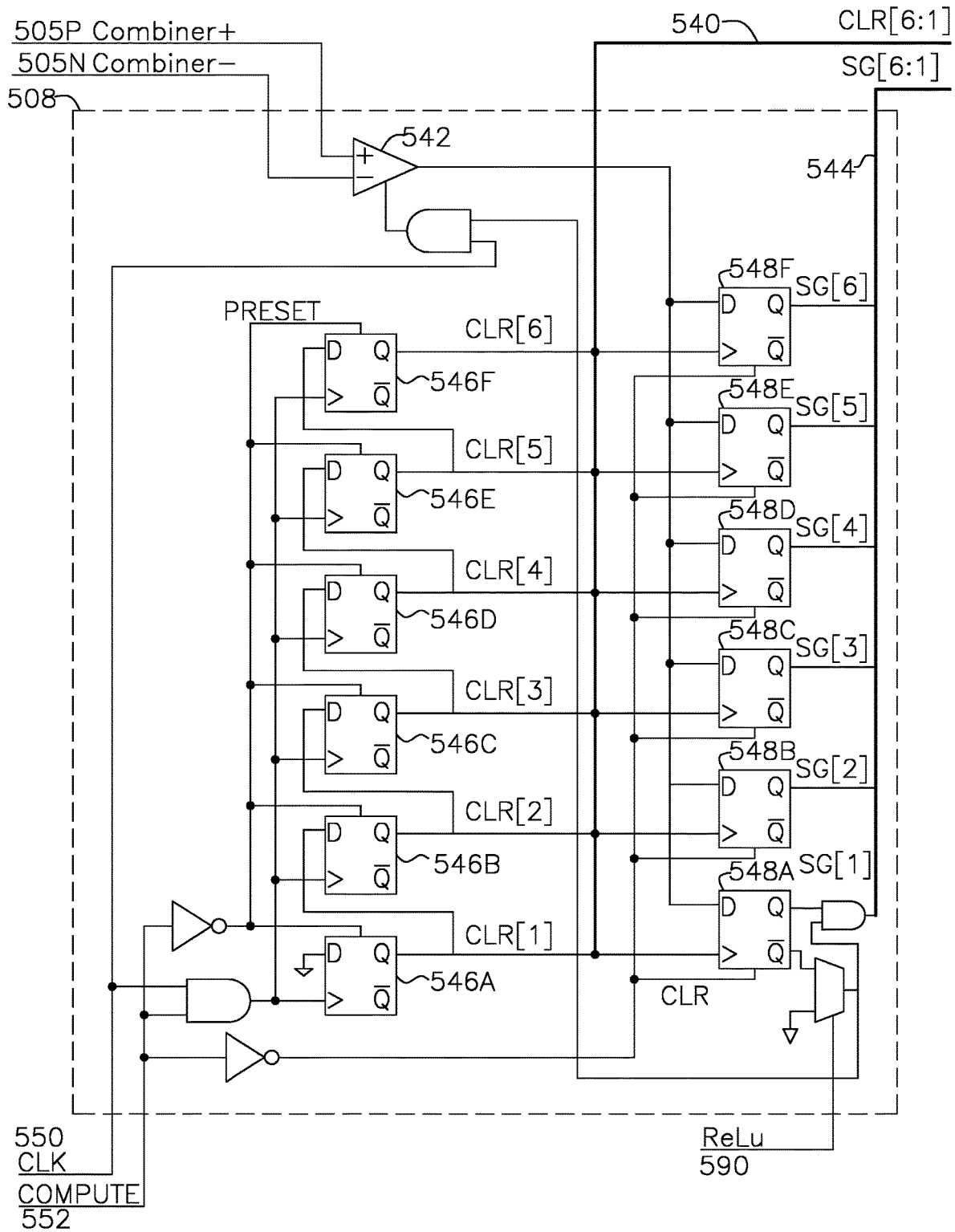
FIG. 5D shows a successive approximation logic and control module which includes ReLU functionality for additional power savings for the control module of FIG. 5A.

FIG. 5D shows an analogous SAR logic and control, with the addition of ReLU input, which has the effect of stopping the conversion when the input value is negative, as determined by the first conversion of most significant bit SG[1].

Figure 5E:
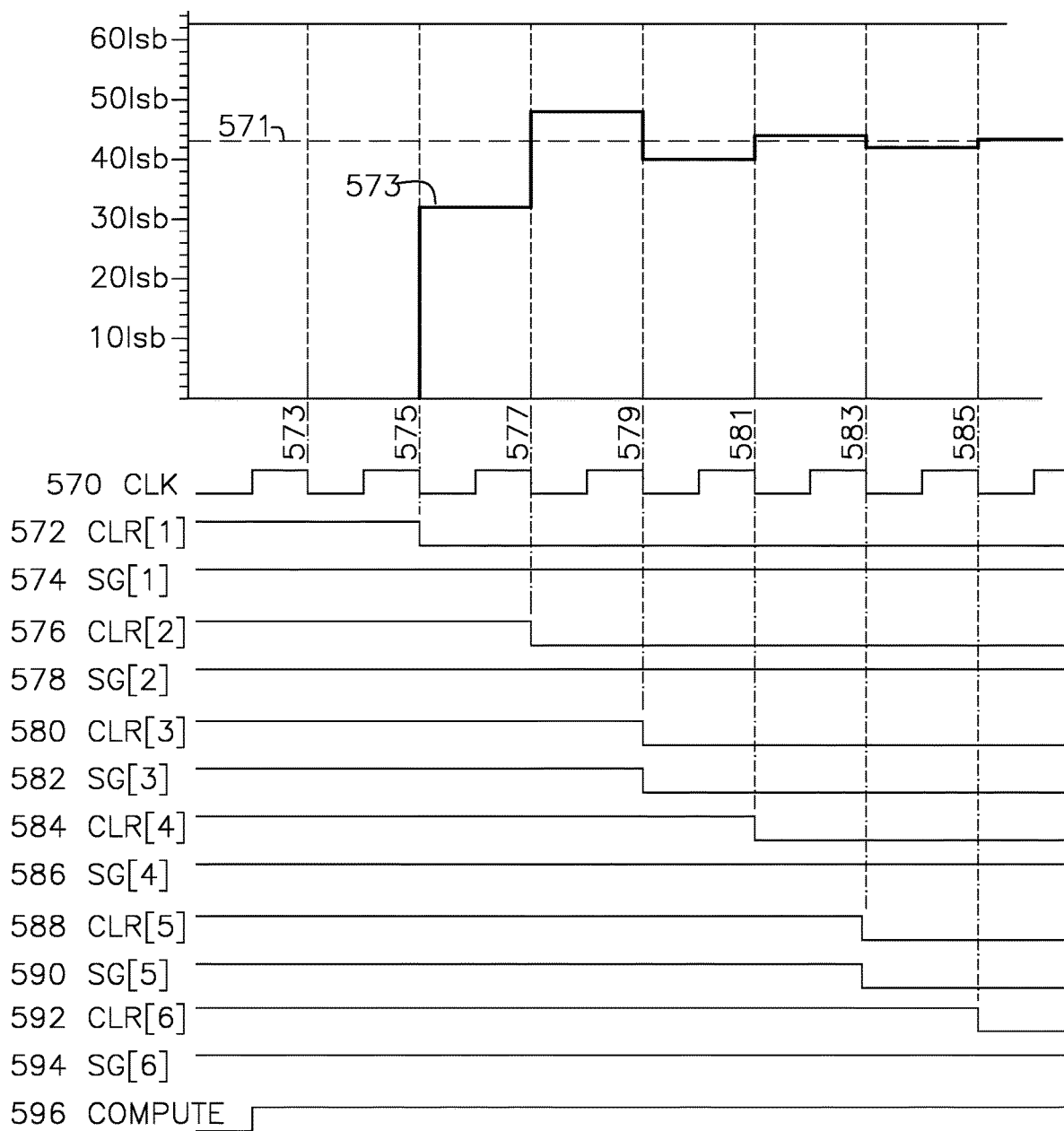
FIG. 5E shows waveform plots for the operation of FIG. 5C.

FIG. 5E shows waveforms for operation of the UE SAR and SAR controller. Compute 596 input enables the SAR controller 508 when high and enables clock 570 input to the internal registers and DFFs. Plot 573 shows the voltage change as the output of combiner 504 as the groups of SAR UE are switched on and off the charge transfer bus 220P and 220N using successive approximation techniques. A charge level 571 from the output of combiner 504 is input to the SAR controller comparator 542. Generally, an SAR operates by adding and subtracting amounts of charge, each of which are half of a previous value. In the case of a range of 64, the first step adds 32, and either subtracts or adds 16 depending on whether a threshold is increased from the input value. Subsequent steps sequentially add or subtract 8, 4, 2, and 1, and the process may stop at any time, with the digitized value being represented as each of the decision steps to add or subtract charge. In the present UE SAR controller, the charge transfer capacitors of each SAR are added or removed in a successive manner, resulting in the groupings of 32 SAR UE 502-1, 16 SAR UE 502-2, 8 SAR UE 502-3, 4 SAR UE 502-4, 2 SAR UE 502-5, and 1 SAR UE 502-6. In plot 573, the initial charge is 0, and so first clock edge at time 573 results in the application of weight 32 of 506-2 to the charge bus (corresponding to SG[1]=1. The groups of SAR UE 502-1 to 502-6 may transfer positive or negative charge with the corresponding SG (sign) input, which is controlled by the SAR logic 508. The next decision is made at time 575, and since the value at time 575 is below input 571, an additional 8 SAR UEs charge from 502-3 are added. Waveform 573 value now exceeds input 571, so 4 a subtractive charge from SAR UEs is applied at time 577, and each subsequent clock 579, 581, 583, and 585 results in the addition or subtraction of charge as shown, resulting in the output value [1 1 0 1 0 1] corresponding to SG[1:6].

Figure 6:
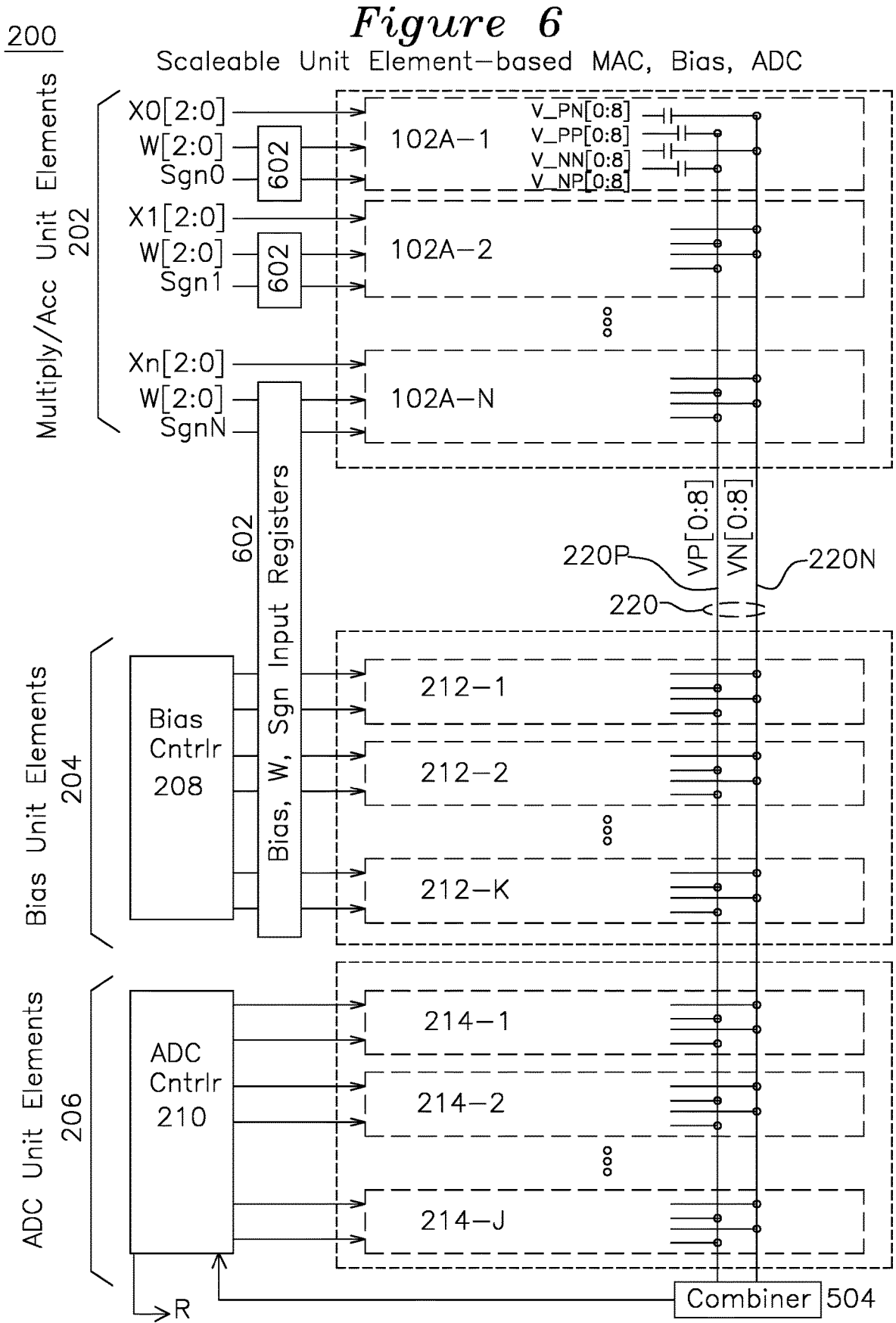
FIG. 6 shows a MAC of FIG. 2 with a sequence of registered weight and sign input values.

In another example of the invention, FIG. 6 shows the architecture of FIG. 2 as was previously described, with the addition of input registers 602, such that a series of activation matrix X and signed kernel matrix W can be applied with E bias values and converted to an output R value for each computation, thereby providing additional optional functionality for selecting a set of weights and sign for a column multiply-accumulate with varying X input and fixed weight and sign kernel values.

The present multiplier architecture has certain advantages. In the prior art, multi-stage multipliers are synchronous devices with a running clock, which requires energy for displacement currents associated with each clock edge transition. In the various examples of the invention, the multiplication is operative asynchronously, and without any clocks, the multiplication value changing and being updated asynchronously when a multiplicand input changes value. Additionally, the present invention has the advantage of scalability, in that additional MAC UEs, Bias UEs, and ADC UEs may be chained together on a common charge transfer bus as shown in the figures, such that each additional unit element may be flexibly added or isolated from the charge transfer bus, and the accumulation of each multiplication result occurs on a respective charge transfer bus. In an example use case, the invention may be used where the W kernel values are static weight coefficients and the X multiplicands are dynamic for dot product computations in artificial intelligence applications.

The proceeding has been a description of the various embodiments of the invention, but does not limit the invention to only the example embodiments shown. For example, the logic gates are shown as NAND such as 320P of FIG. 3B generating a "positive output" 322PN and complement or negative output 324PP. A NAND gate is known to produce a logic 0 output when logic inputs are all 1, and a logic 1 at other times, and inverter 322N is known to invert a logic 1 into a logic 0 and visa versa. The examples showing NAND gates and inverters could also be accomplished with AND gates and inverters, with the positive and negative charge transfer bus connections reversed, as an obvious variant to perform the same functions, without limitation to the generation of complementary outputs from each NAND or AND gate, the complementary outputs which may variously be referred to as an "output" and "complement output", or "positive output" and "negative output" in the spirit of the invention, each providing transfer of charge for the charge transfer capacitor of value Cu to a respective charge transfer bus line. Accordingly, recitations of NAND logic in the claims include the obvious gate varients, including AND gates, OR gates, NOR gates, and combinations of logic elements which perform the functions as described. Similarly, the polarity of the sign bit given as 0 for positive and 1 for negative for clarity in explanations, and it is understood that this is only one convention for understanding the examples of the invention. Computational examples for the charge combiner for N=766 (where N is the sum of first plurality of MAC UE, second plurality of Bias UE, and third plurality of ADC UE), with each NAND gate or inverter output coupled to an charge transfer line with capacitance Cu (unit capacitance) are given, where 8 Cs (or alternatively 8 Cu) is understood to be a scaling factor indicating that the smallest charge summing capacitor should be at least 8 times greater than Cu, the charge transfer capacitor connected between with each NAND gate or inverter output and associated positive or negative charge transfer line. It will be appreciated that deviations and modifications can be made without departing from the scope of the invention, which is defined by appended claims. Various approximations may be used in the specification of the patent application, the approximations are understood to refer to ranges from a nominal value. A value which is "substantially" a nominal value is understood to be in the range of a factor of ½ to 2 times the nominal value. A value which is "on the order of" a nominal value or "an order of magnitude" of a nominal value is understood to be in the range $\frac{1}{10}$th to 10× the nominal value.

We claim:

1. Multiplier-accumulator (MAC) with Analog to Digital Converter (ADC) comprising:
    a differential charge transfer bus comprising a plurality of weighted positive charge transfer lines and a plurality of weighted negative charge transfer lines;
    a first plurality of unit elements (UEs) configured as multiply-accumulate MAC UEs performing multiply-accumulate operations on respective X and W digital inputs, each MAC UE providing a multiplication result as a charge transferred to the differential charge transfer bus;
    a second plurality of unit elements (UEs) configured as Bias UEs, each Bias UE having a bias digital input and coupled to the differential charge transfer bus, each Bias UE placing a bias value as a charge onto the differential charge transfer bus according to the bias digital input;
    a third plurality of unit elements configured as ADC UEs arranged in a binary sequence of ADC UE groups, at least one subsequent group of ADC UEs having twice the number of ADC UEs as a previous group of ADC UEs, each ADC UE operative to convert a charge present on the differential charge transfer bus into a digital output value;

a charge combiner coupled to the differential charge transfer bus and generating a combined charge value to a comparator, the comparator generating a comparison output;

a successive approximation register (SAR) controller coupled to the comparison output and to a plurality of registers, each register coupled to a corresponding group of SAR-UEs and causing each corresponding group of SAR UEs to transfer or remove charge on the differential charge transfer bus until a number of bits equal to a number of registers in the plurality of registers has shifted through the plurality of registers, thereby generating a digital MAC output.

2. The MAC with ADC of claim 1 where the positive charge transfer lines and negative charge transfer lines are each nine in number and have respective weights of 1, 2, 4, 2, 4, 8, 4, 8, and 16.

3. The MAC with ADC of claim 2 where a sum of the first plurality of UEs configured as MAC UEs, the second plurality of UEs configured as Bias UEs, and the third plurality of UEs configured as ADC UEs is approximately 766.

4. The MAC with ADC of claim 1 where the charge combiner comprises a positive charge combiner and a negative charge combiner, each positive charge combiner and negative charge combiner comprising capacitors, each capacitor having a first terminal connected to a respective positive charge transfer line or negative charge transfer line, and a second terminal summed to a second terminal of other capacitors of the charge combiner.

5. The MAC with ADC of claim 4 where, for a scaling factor Cs equal to or greater than a smallest value of a charge transfer capacitor of a MAC UE or Bias UE coupled to a charge transfer line, a charge transfer line with weight 1 has a summing capacitor value of approximately 8 Cs, a charge transfer line with weight 2 has a summing capacitor value of approximately 16 Cs, a charge transfer line with weight 4 has a summing capacitor value of approximately 33 Cs, a charge transfer line with weight 8 has a summing capacitor value of approximately 69 Cs, and a charge transfer line with weight 16 has a summing capacitor value of approximately 152 Cs.

6. The MAC with ADC of claim 1 where each MAC UE, Bias UE, and ADC UE is configured to have associated digital input bits coupled to NAND gates, each NAND gate configured to generate a positive output and a negative output, the positive output coupled through a charge transfer capacitor to a respective positive charge transfer line, and the negative output coupled through a charge transfer capacitor to a respective negative charge transfer line.

7. The MAC with ADC of claim 1 where each MAC UE is coupled to the differential charge transfer bus, each MAC UE receiving a respective X digital input and a respective W digital input which includes a sign bit, each MAC UE comprising a positive MAC UE and a negative MAC UE, each positive MAC UE and negative MAC UE comprising:

a plurality of NAND-groups equal to a total number of W digital input bits, each NAND-group comprising a plurality of NAND gates, each NAND gate of a NAND-group having one input commonly coupled to a W digital input bit, one input coupled to a unique one of the X digital input bits, and either the sign bit or an inverted said sign bit, each NAND gate generating a positive output and a negative output;

each NAND gate positive output and each NAND gate negative output coupled through a charge transfer capacitor to a unique charge transfer line of the differential charge transfer bus.

8. The MAC with ADC of claim 7 where a NAND gate which is enabled when the sign bit is not asserted has a respective positive output coupled through a respective charge transfer capacitor to a negative charge transfer line and a respective negative output coupled through a respective charge transfer capacitor to a positive charge transfer line.

9. The MAC with ADC of claim 7 where a NAND gate which is enabled when the sign bit is asserted has a respective positive output coupled through a respective charge transfer capacitor to a positive charge transfer line and a respective negative output coupled through a respective charge transfer capacitor to a negative charge transfer line.

10. A multiplier-accumulator (MAC) with Analog to Digital Converter (ADC) comprising:

a differential charge transfer bus comprising a plurality of weighted positive charge transfer lines and a plurality of weighted negative charge transfer lines;

a first plurality of unit elements configured as MAC UEs coupled to the differential charge transfer bus and each MAC UE configured to have a digital X input and a digital W input;

a second plurality of unit elements configured as Bias UEs coupled to the differential charge transfer bus and configured to have a digital E input;

a third plurality of unit elements configured as ADC UEs coupled to the differential charge transfer bus and configured to convert a charge coupled to the differential charge transfer bus into a digital output value;

where at least one of a MAC UE or a Bias UE has an input coupled to a NAND gate generating an output and an inverted output, each of the output and the inverted output coupled through a charge transfer capacitor to the differential charge transfer bus.

11. The MAC with ADC of claim 10 wherein at least one MAC UE of the first plurality of MAC UEs comprises:

NAND-groups equal in number to a number of bits of the W input, each NAND-group comprising NAND gates equal in number to a number of bits of the X input, each NAND gate in a NAND-group having an input coupled to one of the W input bits and having an input coupled to a unique one of the X input bits.

12. The MAC with ADC of claim 10 wherein at least one Bias UE of the second plurality of Bias UEs comprises a plurality of NAND gates, each NAND gate generating an output and an inverted output, each output coupled to a positive charge transfer line and each inverted output coupled to a negative charge transfer line.

13. The MAC with ADC of claim 10 wherein at least one ADC UE of said plurality of ADC UEs comprises a plurality of NAND gates generating an output and an inverted output, each output coupled to a one of the weighted positive charge transfer lines and each inverted output coupled to one of the weighted a negative charge transfer lines, said plurality of ADC UEs transferring and removing charge from the differential charge transfer bus in a binary sequence of successive approximation, the ADC UEs having inputs coupled to a controller which switches ADC UEs according to a summed charge on the charge transfer bus.

14. The MAC with ADC of claim 10 where the weighted positive charge transfer lines and the weighted negative charge transfer lines are each nine in number and have weights 1, 2, 4, 2, 4, 8, 4, 8, and 16.

15. A Multiply-accumulate (MAC) generating a digital output, the MAC comprising:
a differential charge transfer bus;
a first plurality of unit elements (UEs) configured as multiplier-accumulator unit elements (MAC UEs), each MAC UE having a respective digital X input and a respective digital W input, the first plurality of MAC UEs coupling charge into the differential charge transfer bus as bitwise products of each said input X and each said input W;
a second plurality of Unit Elements (UEs) configured as Bias UEs coupled to the differential charge transfer bus and transferring a charge to the differential charge transfer bus according to a bias digital input;
a third plurality of Unit Elements (UEs) configured as Analog to Digital Converter Unit Elements (ADC UEs) coupled to the differential charge transfer bus;
a charge combiner combining charges on the differential charge transfer bus to positive charge line and negative charge line, the positive charge line and negative charge line coupled to a comparator, the comparator coupled to a successive approximation controller, the successive approximation controller sequentially switching increasingly smaller numbers of ADC UEs of the third plurality of ADC UEs according to the output of the comparator, each comparison generating a bit of the digital output.

16. The MAC of claim 15 where the successive approximation controller is responsive to an ReLU input, and when the ReLU input is asserted and the digital output is negative, the successive approximation controller outputting 0.

17. The MAC of claim 15 where at least one MAC UE comprises a plurality of NAND-groups equal in number to a number of W input bits, each of the NAND-groups comprising NAND gates equal in number to a number of X input bits, each NAND gate of a NAND-group having an input coupled to a unique one of the W input bits and an input coupled to each of the X input bits.

18. The MAC of claim 17 where at least one MAC UE comprises:
a positive MAC UE and a negative MAC UE;
the positive MAC UE is enabled only when a sign bit of the W input is positive, and the negative MAC UE is enabled only when the sign bit of the W input is negative;
each positive MAC UE and each negative MAC UE comprising a plurality of NAND-groups equal in number to a number of W input bits, each of the NAND-groups comprising NAND gates equal in number to a number of X input bits, each NAND gate of a NAND-group coupled to a unique one of the W input bits, to each of the X input bits, and to either the sign bit or an inversion of the sign bit.

19. The MAC of claim 18 where each NAND gate of the positive MAC UE has a positive output and a negative output, the positive output coupled to a charge transfer line of the negative charge transfer bus and the negative output coupled to a charge transfer line of the positive charge transfer bus.

20. The MAC of claim 15 where the differential charge transfer bus comprises a positive charge transfer bus and a negative charge transfer bus, each positive charge transfer bus and negative charge transfer bus comprising nine charge transfer lines with weight 1, 2, 4, 2, 4, 8, 4, 8, and 16.

21. The MAC of claim 15 where each of the NAND gates is also coupled to a clear input for initializing charges from at least one of the MAC UEs, Bias UEs, and ADC UEs to be transferred to the differential charge transfer bus.

* * * * *